United States Patent
Plachinda et al.

(10) Patent No.: US 9,761,408 B2
(45) Date of Patent: Sep. 12, 2017

(54) PATTERN MATCHING USING A LAMELLA OF KNOWN SHAPE FOR AUTOMATED S/TEM ACQUISITION AND METROLOGY

(71) Applicant: FEI Company, Hillsboro, OR (US)

(72) Inventors: Paul Plachinda, Hillsboro, OR (US); Liang Zhang, Portland, OR (US); Justin Roller, Portland, OR (US)

(73) Assignee: FEI Company, Hillsboro, OR (US)

( * ) Notice: Subject to any disclaimer, the term of this patent is extended or adjusted under 35 U.S.C. 154(b) by 17 days.

(21) Appl. No.: 14/630,416

(22) Filed: Feb. 24, 2015

(65) Prior Publication Data

US 2016/0247661 A1 Aug. 25, 2016

(51) Int. Cl.
*G01N 1/28* (2006.01)
*H01J 37/22* (2006.01)
*H01J 37/28* (2006.01)
*H01J 37/20* (2006.01)

(52) U.S. Cl.
CPC ............ *H01J 37/222* (2013.01); *H01J 37/20* (2013.01); *H01J 37/28* (2013.01); *H01J 2237/223* (2013.01); *H01J 2237/24578* (2013.01); *H01J 2237/2801* (2013.01); *H01J 2237/2802* (2013.01)

(58) Field of Classification Search
None
See application file for complete search history.

(56) References Cited

U.S. PATENT DOCUMENTS

| | | | | |
|---|---|---|---|---|
| 5,576,543 A * | 11/1996 | Dingley | ................. | H01J 37/26 250/311 |
| 5,783,830 A * | 7/1998 | Hirose | ................. | H01J 37/3056 250/442.11 |
| 6,577,970 B2 * | 6/2003 | Houge | ................. | G01N 23/225 702/150 |
| 2003/0130803 A1 * | 7/2003 | Chou | ................. | G01N 23/2251 702/27 |
| 2010/0300873 A1 * | 12/2010 | Blackwood | .............. | G01N 1/32 204/192.33 |
| 2012/0025073 A1 * | 2/2012 | Kumar | ................. | G01N 23/203 250/307 |
| 2014/0084157 A1 * | 3/2014 | Miller | ................. | H01J 37/3023 250/307 |

(Continued)

OTHER PUBLICATIONS

Strauss et al., ("Automated Transmission Electron Microscopy for Defect Review and Metrology of Si Devices", ASMC 2013 Semi Advanced Semiconductor Manufacturing Conference, May 1, 2013, 5 pages).*

(Continued)

*Primary Examiner* — Andrew Smyth
(74) *Attorney, Agent, or Firm* — Scheinberg & Associates, P.C.; John B. Kelly

(57) ABSTRACT

A method for automatically imaging in an electron microscope (SEM, TEM or STEM) features in a region of interest in a lamella without prior knowledge of the features to be imaged, thereby enabling multiple electron microscope images to be obtained by stepping from the first image location without requiring the use of image recognition of individual image features. By eliminating the need for image recognition, substantial increases in image acquisition rates may be obtained.

20 Claims, 17 Drawing Sheets

(56) References Cited

U.S. PATENT DOCUMENTS

2015/0253353 A1\* 9/2015 Alvis .................... G01Q 30/02
850/9

OTHER PUBLICATIONS

Michael Strauss et al., "Automated Transmission Electron Microscopy for Defect Review and Metrology of Si Devices", ASMC 2013 Semi Advanced Semiconductor Manufacturing Conference, May 1, 2013, 5 pages.

Ozan Ugurlu et al., "High-Volume Process Monitoring of FEOL 22nm FinFET Structures Using an Automated STEM", Proceedings of SPIE, Apr. 10, 2013, 14 pages.

\* cited by examiner

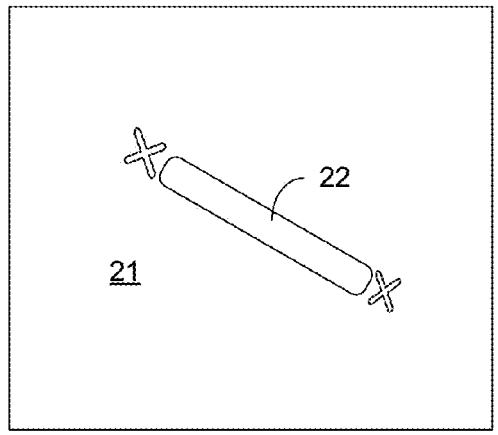
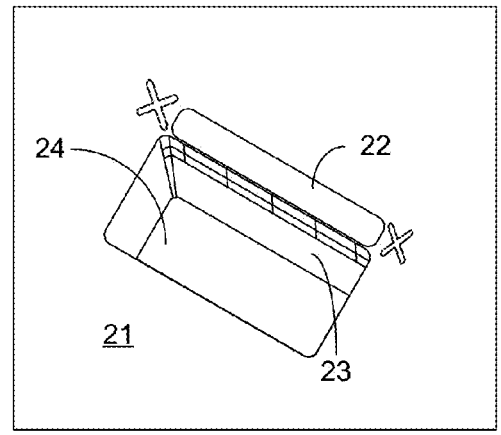
FIG. 2
Prior Art
FIG. 3
Prior Art
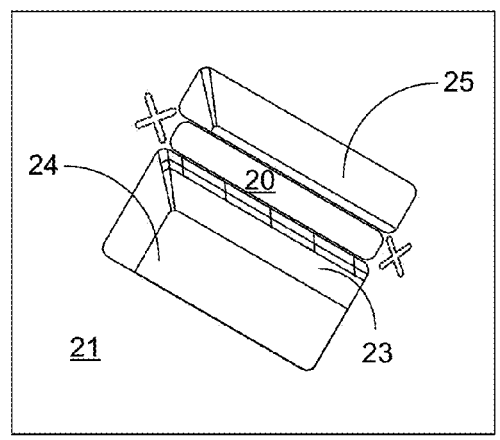
FIG. 4
Prior Art

PATTERN MATCHING USING A LAMELLA OF KNOWN SHAPE FOR AUTOMATED S/TEM ACQUISITION AND METROLOGY

TECHNICAL FIELD OF THE INVENTION

The present invention relates to the preparation of samples and methods of sample handling for analysis by electron microscopes.

BACKGROUND OF THE INVENTION

Semiconductor manufacturing, such as the fabrication of integrated circuits, typically entails the use of photolithography. A semiconductor substrate on which circuits are being formed, usually a silicon wafer, is coated with a material, such as a photoresist, that changes solubility when exposed to radiation. A lithography tool, such as a mask or reticle, positioned between the radiation source and the semiconductor substrate casts a shadow to control which areas of the substrate are exposed to the radiation. After the exposure, the photoresist is removed from either the exposed or the unexposed areas, leaving a patterned layer of photoresist on the wafer that protects parts of the wafer during a subsequent etching or diffusion process.

The photolithography process allows multiple integrated circuit devices or electromechanical devices, often referred to as "chips," to be formed on each wafer. The wafer is then cut up into individual dies, each including a single integrated circuit device or electromechanical device. Ultimately, these dies are subjected to additional operations and packaged into individual integrated circuit chips or electromechanical devices.

During the manufacturing process, variations in exposure and focus require that the patterns developed by lithographic processes be continually monitored or measured to determine if the dimensions of the patterns are within acceptable ranges. The importance of such monitoring, often referred to as process control, increases considerably as pattern sizes become smaller, especially as minimum feature sizes approach the limits of resolution available by the lithographic process. In order to achieve ever-higher device density, smaller and smaller feature sizes are required. This may include the width and spacing of interconnecting metallization lines, spacing and diameter of contact holes and vias, and the surface geometry such as corners and edges of various features. Features on the wafer are three-dimensional structures and a complete characterization must describe not just a surface dimension, such as the top width of a line or trench, but a complete three-dimensional profile of the feature. Process engineers must be able to accurately measure the critical dimensions (CD) of such surface features to fine tune the fabrication process and to assure a desired device geometry.

Typically, CD measurements are made using instruments such as a scanning electron microscope (SEM). In a scanning electron microscope (SEM), a primary electron beam is focused to a fine spot that scans the surface to be observed. Secondary electrons are emitted from the surface as it is impacted by the primary beam. The secondary electrons are detected, and an image is formed, with the brightness at each point of the image being determined by the number of secondary electrons detected when the beam impacts a corresponding spot on the surface. As features continue to get smaller and smaller, however, there comes a point where the features to be measured are too small for the resolution provided by an ordinary SEM.

Transmission electron microscopes (TEMs) allow observers to see extremely small features, on the order of nanometers. In contrast to SEMs, which only image the surface of a material, TEMs allows the additional capability to analyze the internal structure of a sample. In a TEM, a broad beam impacts the sample and electrons that are transmitted through the sample are focused to form an image of the sample. The sample must be sufficiently thin to allow many of the electrons in the primary beam to travel though the sample and exit on the opposite site. Samples are typically less than 100 nm thick.

In a scanning transmission electron microscope (STEM), a primary electron beam is focused to a fine spot, and the spot is scanned across the sample surface. Electrons that are transmitted through the substrate are collected by an electron detector on the far side of the sample, and the intensity of each point on the image corresponds to the number of electrons collected as the primary beam impacts a corresponding point on the surface.

As semiconductor geometries continue to shrink, manufacturers increasingly rely on transmission electron microscopes (TEMs) for monitoring the process, analyzing defects, and investigating interface layer morphology. The term "TEM" as used herein refers to a TEM or a STEM, and references to preparing a sample for a TEM are to be understood to also include preparing a sample for viewing on an STEM. Because a sample must be very thin for viewing with transmission electron microscopy (whether TEM or STEM), preparation of the sample can be delicate, time-consuming work. SEMs and S/TEMS are not limited to semiconductor manufacturing only but are used in a wide variety of applications where observing extremely small features is necessary. For example, in life sciences, images are acquired from a region of interest from samples prepared on a microtome.

Thin TEM samples cut from a bulk sample material are known as "lamellae" (singular, "lamella"). Lamellae are typically less than 100 nm thick, but for some applications a lamella must be considerably thinner. With advanced semiconductor fabrication processes at 30 nm and below, a lamella needs to be less than 20 nm in thickness in order to avoid overlap among small scale structures. Currently, thinning below 30 nm is difficult and not robust. Thickness variations in the sample result in lamella bending, overmilling, or other catastrophic defects. For such thin samples, lamella preparation is a critical step in TEM analysis that significantly determines the quality of structural characterization and analysis of the smallest and most critical structures.

Several techniques are known for preparing TEM specimens. These techniques may involve cleaving, chemical polishing, mechanical polishing, or broad beam low energy ion milling, or combining one or more of the above. The disadvantage to these techniques is that they are not site-specific and often require that the starting material be sectioned into smaller and smaller pieces, thereby destroying much of the original sample.

Other techniques generally referred to as "lift-out" techniques use focused ion beams to cut the sample from a substrate or bulk sample without destroying or damaging surrounding parts of the substrate. Such techniques are useful in analyzing the results of processes used in the fabrication of integrated circuits, as well as materials general to the physical or biological sciences. These techniques can be used to analyze samples in any orientation (e.g., either in cross-section or in plan view). Some techniques extract a sample sufficiently thin for use directly in a TEM; other techniques extract a "chunk" or large sample that requires additional thinning before observation. In addition, these "lift-out" specimens may also be directly analyzed by other analytical tools, other than TEM. Techniques where the sample is extracted from the substrate within the focused ion beam ("FIB") system vacuum chamber are commonly referred to as "in-situ" techniques; sample removal outside the vacuum chamber (as when the entire wafer is transferred to another tool for sample removal) are called "ex-situ" techniques.

Samples which are sufficiently thinned prior to extraction are often transferred to and mounted on a metallic grid covered with a thin electron transparent film for viewing. FIG. 1 shows a sample mounted onto a prior art TEM grid 10. A typical TEM grid 10 is made of copper, nickel, or gold. Although dimensions can vary, a typical grid might have, for example, a diameter of 3.05 mm and have a middle portion 12 consisting of cells 14 of size 90×90 $\mu m^2$ and bars 17 with a width of 35 $\mu m$. The electrons in an impinging electron beam will be able to pass through the cells 14, but will be blocked by the bars 17. The middle portion 12 is surrounded by an edge portion 16. The width of the edge portion is 0.225 mm. The edge portion 16 has no cells or holes, with the exception of the orientation mark 18. A thin carbon film 19 is attached to the bottom side of TEM grid 10. TEM specimens to be analyzed are placed or mounted within cells 14 on top of carbon film 19.

In one commonly used ex-situ sample preparation technique, a protective layer 22 of a material such as tungsten is deposited over the area of interest on a sample surface 21 as shown in FIG. 2 using electron beam or ion beam deposition. Next, as shown in FIGS. 3-4, a focused ion beam using a high beam current with a correspondingly large beam size is used to mill large amounts of material away from the front and back portion of the region of interest. The remaining material between the two milled rectangular trenches 24 and 25 forms a thin vertical sample section 20 that includes an area of interest. The angle of the FIB (not shown) used in the milling is generally angled at 90° from the sample surface 21. This allows for the FIB to mill straight down. The trench 25 milled on the back side of the region of interest is smaller than the front trench 24. The smaller back trench is primarily to save time, but the smaller trench also prevents the finished sample from falling over flat into larger milled trenches which may make it difficult to remove the specimen during the micromanipulation operation. When sample section 20 is eventually extracted, it will lay horizontally on a TEM/STEM grid exposing a TEM normal viewing side 23.

As shown in FIG. 5, once the specimen reaches the desired thickness, the stage is tilted and a U-shaped cut 26 is made at an angle partially along the perimeter of the sample section 20, leaving the sample hanging by tabs 28 at either side at the top of the sample. The sample section 20 that is cut out has a TEM normal viewing side 23 in the shape of a rectangle. The small tabs 28 allow the least amount of material to be milled free after the sample is completely FIB polished, reducing the possibility of redeposition artifacts accumulating on the thin specimen. The sample section is then further thinned using progressively finer beam sizes. Finally, the tabs 28 are cut to completely free the thinned lamella 27. When the lamella 27 is cut out and placed horizontally—the lamella 27 is generally a rectangular shape. After the final tabs of material are cut free, lamella 27 may be observed to move or fall over slightly in the trench.

In ex-situ processes, the wafer containing lamella 27 is removed from the vacuum chamber containing the FIB and placed under an optical microscope equipped with a micromanipulator. A probe attached to the micromanipulator is positioned over the lamella and carefully lowered to contact it. Electrostatic forces will attract lamella 27 to the probe tip 28 (shown in FIG. 6) or the micromanipulator can have a hollow center wherein it can create a vacuum through the probe tip to secure the lamella. The tip 28 with attached lamella 27 is then typically moved to a TEM grid 10 as shown in FIG. 7 and lowered until lamella 27 is placed on the grid in one of the cells 14 between bars 17. FIG. 8 is a picture of a lamella 27 on a traditional carbon grid. As shown in FIG. 8, even with the successful transportation of lamella 27 onto the carbon film 19, the orientation of the lamella 27 is difficult to determine. On account of the general rectangular shape of the lamella, it is difficult to determine whether the lamella 27 has turned 180° or has been inverted during the process of moving the lamella 27 from the vacuum chamber to the carbon grid 13. FIG. 9 shows a carbon grid 13. Carbon grid 13 typically contains 5×5 $\mu m$ holes 81. Holes 81 are not drawn to scale. FIG. 10 is an actual picture showing the placement of a lamella 27 on a carbon film 19 with the region of interest 82 placed directly over a sizeable hole 81.

Although ex-situ methods do not require the labor intensive and time consuming manipulation inside the vacuum chamber, they are unreliable and require a great deal of operator experience. Even with experienced operators, the success range is only about 90%. It can be time consuming and difficult to locate a lamella site and the extraction probe must be very carefully moved into position to avoid damaging the sample or the probe tip. Once a lamella has been completely freed, it can move in unpredictable ways; it can fall over in the trench or in some cases it can actually be pushed up and out of the trench by electrostatic forces. This movement can make it difficult to locate and/or pick up the lamella with the extraction probe. The electrostatic attraction between the probe and the sample is also somewhat unpredictable. In some cases, the lamella may not stay on the probe tip. Instead, it can jump to a different part of the probe. In other cases, the lamella may fall off while the sample is being moved. If the lamella is successfully transferred to the TEM grid, it can be difficult to get the lamella to adhere to the grid support film rather than the probe tip. The lamella will often cling to the probe tip and must be essentially wiped off onto the film. As a result, it is difficult to control the precise placement or orientation of the lamella when it is transferred to the TEM grid. The lamella typically has a region of interest that is intended for imaging. If the lamella 27 is close to bars 17, it is often difficult to determine if the region of interest is properly placed over the carbon grid and if the region of interest is properly aligned with the holes in the carbon film.

Experienced ex-situ plucking users can use a standard glass rod micro manipulator to move and orient the lamella 27 based on optical imaging systems, but any unforeseen motion on the lamella 27 during the plucking and placing process eliminates any confidence of orientation. Unforeseen motion during the process occurs approximately 25% of the time. In addition, the ability to set the sample into a very specific region of interest has a large amount of uncertainty. Traditionally TEM operation requires a person to visually locate and drive the stage to the ROI and then increase the magnification to the desired field of view. The stage is then moved and images are taken at the desired interval.

Currently an operator will write a program in Recipe Editor that uses specific pattern matches of the devices or regions of interest in the lamella window. This requires previous knowledge of the device structure/shape using a pattern match on the device and multiple recipes or branches in the recipe to accommodate each sample type. The operator must then load the specific recipe to match the sample type. However many customers have lots of different types of devices that must be examined and a general recipe that is not device specific would remove the need for operator intervention in matching the recipe to the sample type. In life sciences, a highly trained operator must manually locate and acquire images from the region of interest from samples prepared on a microtome.

What is needed is an improved method for locating a region of interest that obviates the need for multiple recipes to handle multiple sample types, requires less human intervention in the acquisition process, enables automated image acquisition of large areas, and reduces the need for trained operator time. Further, what is needed an improved method for locating a region of interest that obviates the need to pre-define the shape of the ROI and the need to have an operator choose a specific program for automation.

SUMMARY OF THE INVENTION

An object of the invention is to provide a method and apparatus for more rapidly acquiring images of regions of interest on sample lamellae which does not require image acquisition techniques for locating regions to be imaged. The method eliminates the need for multiple recipes dealing with multiple sample types since the orientation of the lamella window may be determined from the crystallographic orientation of the underlying substrate using either electron diffraction or a fast Fourier Transform of an image of the substrate. Alternatively, determination of the orientation of the lamella window may employ edge finders from a lower magnification image of the lamella or the lamella window.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which:

FIGS. 2-5 illustrate prior art steps in an ex-situ sample preparation technique;

DETAILED DESCRIPTION OF PREFERRED EMBODIMENTS

Figure 1:
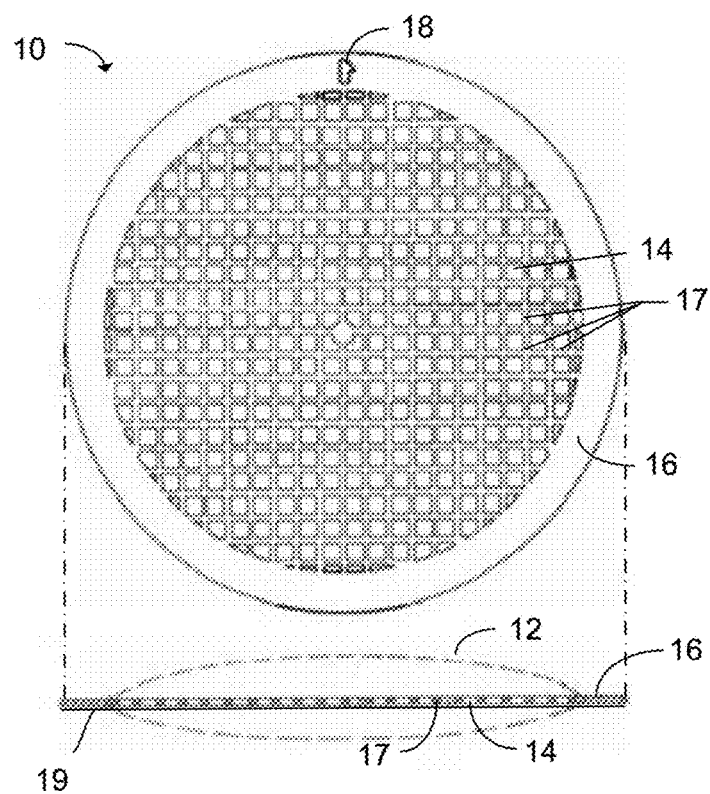
FIG. 1 shows a typical TEM grid.
Figure 5:
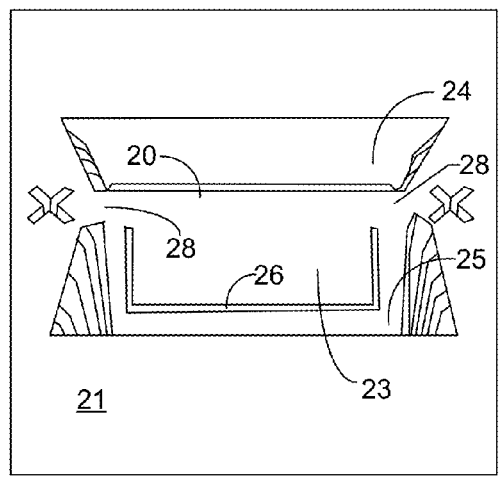
Figure 6:
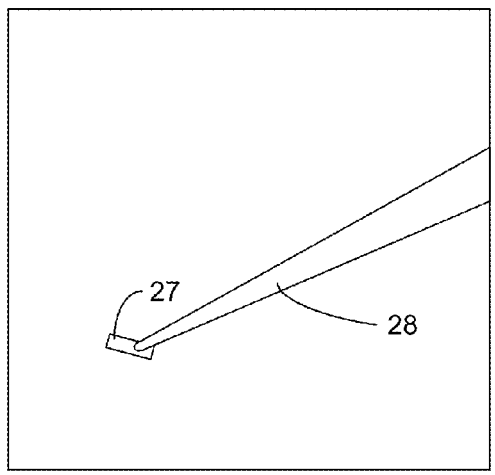
FIGS. 6-7 illustrate the transfer of a lamella using a probe and electrostatic attraction according to the prior art.
Figure 7:
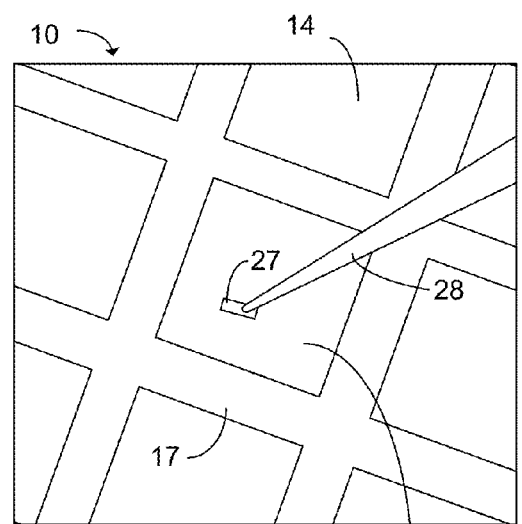
Figure 8:
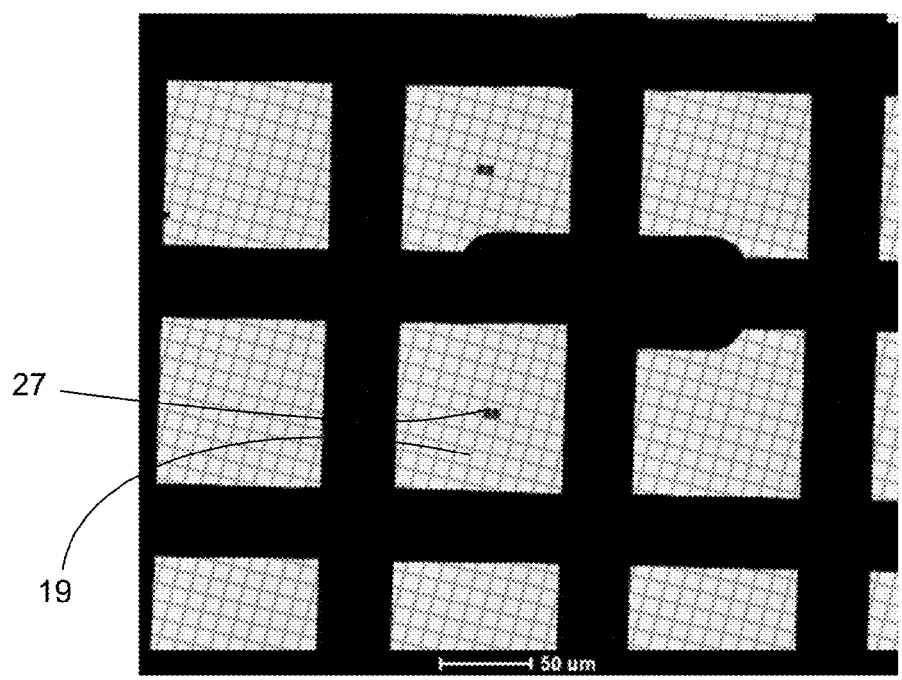
FIG. 8 is a close-up picture of the carbon grid including lamellas on the carbon film.
Figure 9:
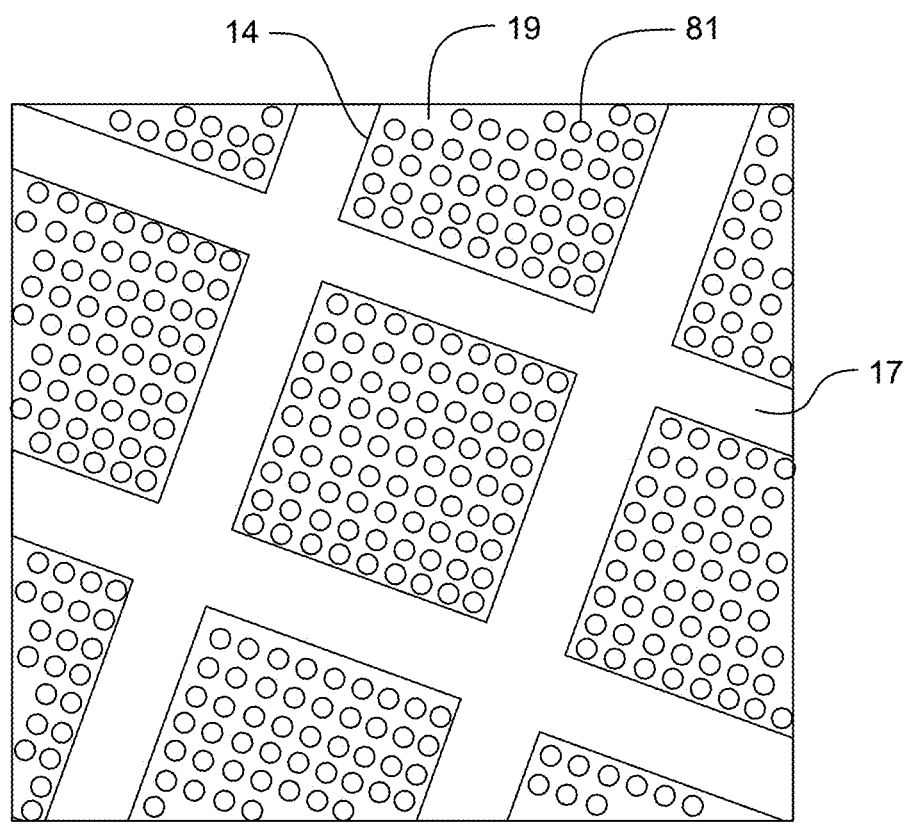
FIG. 9 shows a carbon grid having 5×5 µm holes (not drawn to scale)
Figure 10:
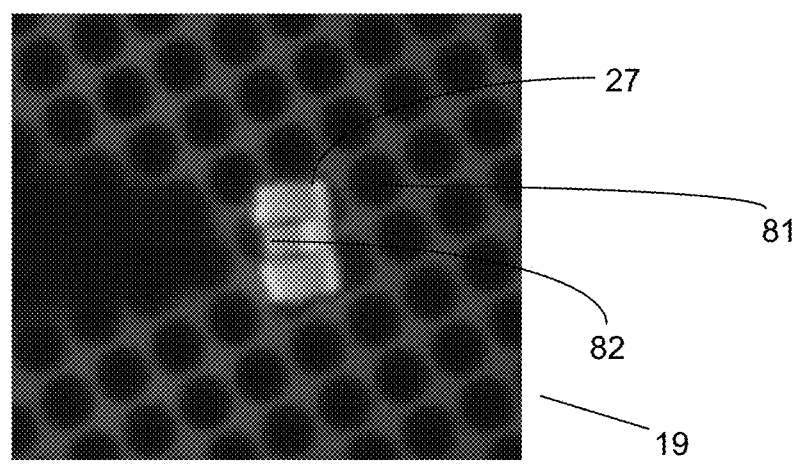
FIG. 10 shows a picture of a lamella lying over a carbon grid wherein the region of interest lies over a hole.

Preferred embodiments of the present invention provide for improved methods for lamella creation from sample and use of the lamella in ex-situ processes. A preferred embodiment of the invention relates to using pattern recognition on lamella generated as part of TEM workflow to locate an area centered vertically on features of interest in the lamella window. A preferred embodiment of the invention relates to generating images along the region of interest (ROI) with no pattern recognition required within the ROI to guide the centering for acquisition. All centering and alignment is set up only by pattern recognition of the known, predetermined geometry of the lamella but with no requirement of pattern recognition within the window that the ROI contains. This allows for acquisition of partial areas or the entire area of the lamella window with and without overlap between the images. In addition, a montage functionality is present to allow image taking along the centerline with vertical shifting up and/or down as required. A preferred embodiment of the invention realizes a true automated picture taker that is independent of the devices or features within the lamella window. A preferred embodiment of the invention relies on the use of beam shifting instead of stage or piezo stage movements to march along the horizontal ROI in a controlled and repeatable fashion that is not possible using a mechanical movement. A general recipe can be used to automatically collect images without needing specific information about the region of interest within the lamella window. This removes the need for human intervention when acquiring S/TEM images of samples of different form/structure during the automation process. One recipe can be used without human intervention to acquire TEM images in any of the acquisition modes (i.e. TEM, HAADF, BF, and DF) across all or part of the FIB thinned lamella window. This removes the need for multiple recipes to handle multiple sample types, requires less human intervention in the acquisition process, enables automated image acquisition of large areas, and reduces the need for trained operator time, which is especially useful in Pathology (for-profit) centers of hospital.

Traditionally TEM operation requires a person to visually locate and drive the stage to the ROI and then increase the magnification to the desired field of view. The stage is then moved and images are taken at the desired interval. In accordance with embodiments of the present invention, a consistent lamella with a predetermined shape provides the initial points for alignment via pattern matching to the ROI. Once the vertical and horizontal coordinates for the center of the window are determined the program can use beam shifting instead of physical stage movements as a strategy to take successive images to the left and right of the center. This effectively removes the need to pre-define the shape of the ROI and the need to have an operator choose a specific program for automation.

Figure 11A:
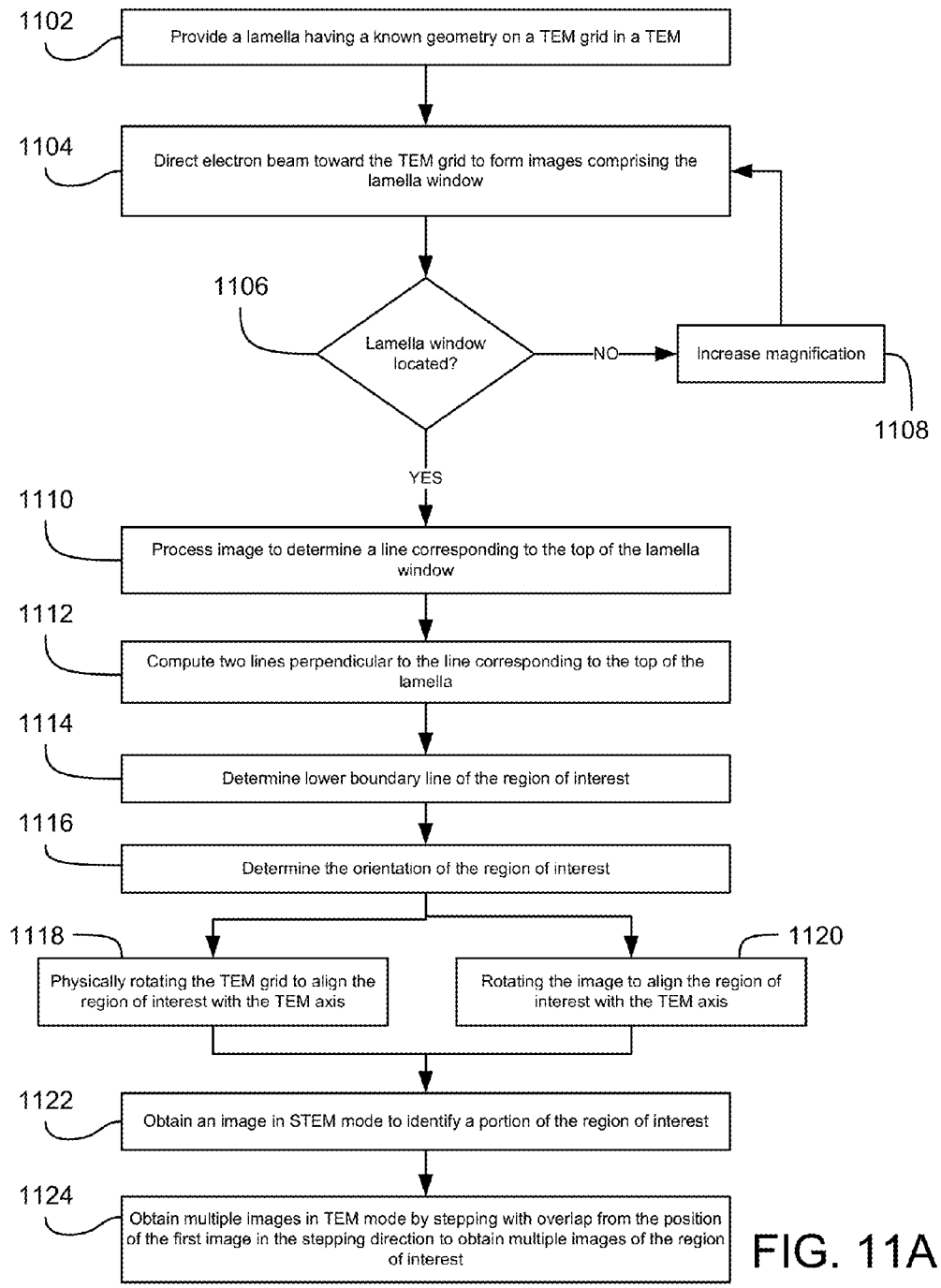
FIG. 11A is a flowchart showing a method, in accordance with a preferred embodiment of the present invention, of automatically imaging on a transmission electron microscope (TEM) the features in a region of interest on a lamella window without requiring knowledge of the features to be imaged.

FIG. 11 is a flowchart showing a method, in accordance with a preferred embodiment of the present invention, of automatically imaging on a transmission electron microscope (TEM) the features in a region of interest on a lamella window without requiring knowledge of the features to be imaged. The method starts at step 1102. At step 1102, a lamella having a known geometry is provided on a TEM grid in the TEM. The lamella is preferably formed by an automated method that creates lamellae having a known geometry.

Figure 12:
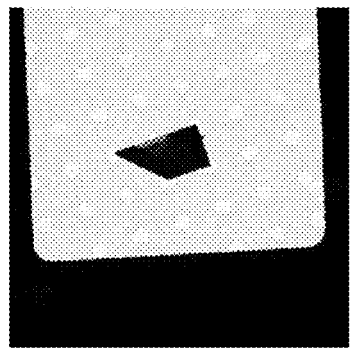
FIG. 12 shows an image of a TEM lamella at 320× magnification.
Figure 13:
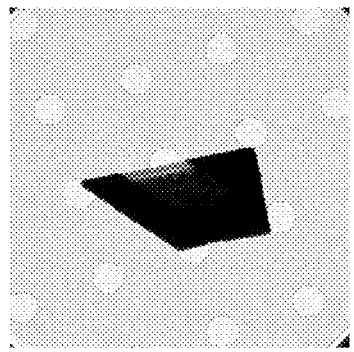
FIG. 13 shows an image of a TEM lamella at 660× magnification.
Figure 14:
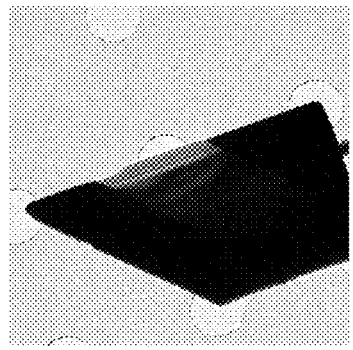
FIG. 14 shows an image of a TEM lamella at 1150× magnification.
Figure 15:
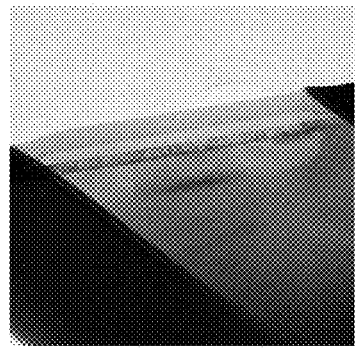
FIG. 15 shows an image of a TEM lamella at 2550× magnification.

Next, the electron beam is directed toward the TEM grid to form an images at various magnifications to locate the lamella window. At step 1104, the electron beam is directed toward the TEM grid to form images comprising the lamella window. At step 1106, the perimeter of the lamella window is determined within the images. If the lamella window has not been located, then the magnification of the microscope is increased (step 1108) and the process returns to step 1106. If the lamella window has been located, then the process proceeds to step 1110. This progression can be seen in FIGS. 12-15. FIG. 12 shows an image of a TEM lamella at 320× magnification. FIG. 13 shows an image of a TEM lamella at 660× magnification. FIG. 14 shows an image of a TEM lamella at 1150× magnification. FIG. 15 shows an image of a TEM lamella at 2550× magnification.

Figure 11B:
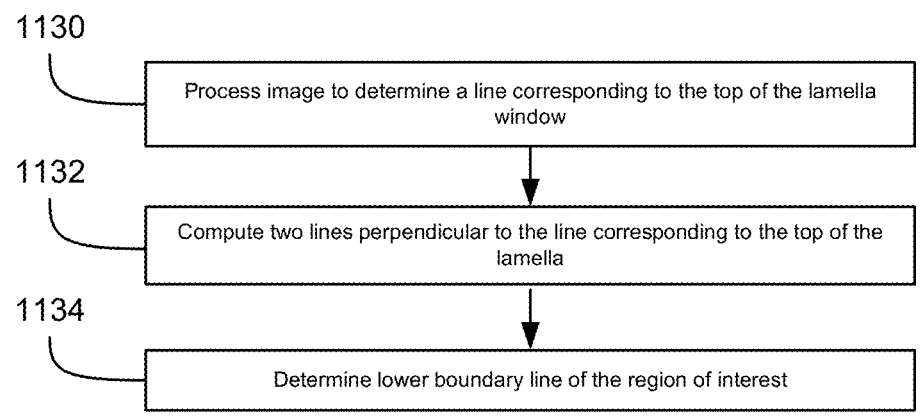
FIG. 11B is a flow chart showing an exemplary embodiment for determining the orientation of the region of interest.
Figure 16:
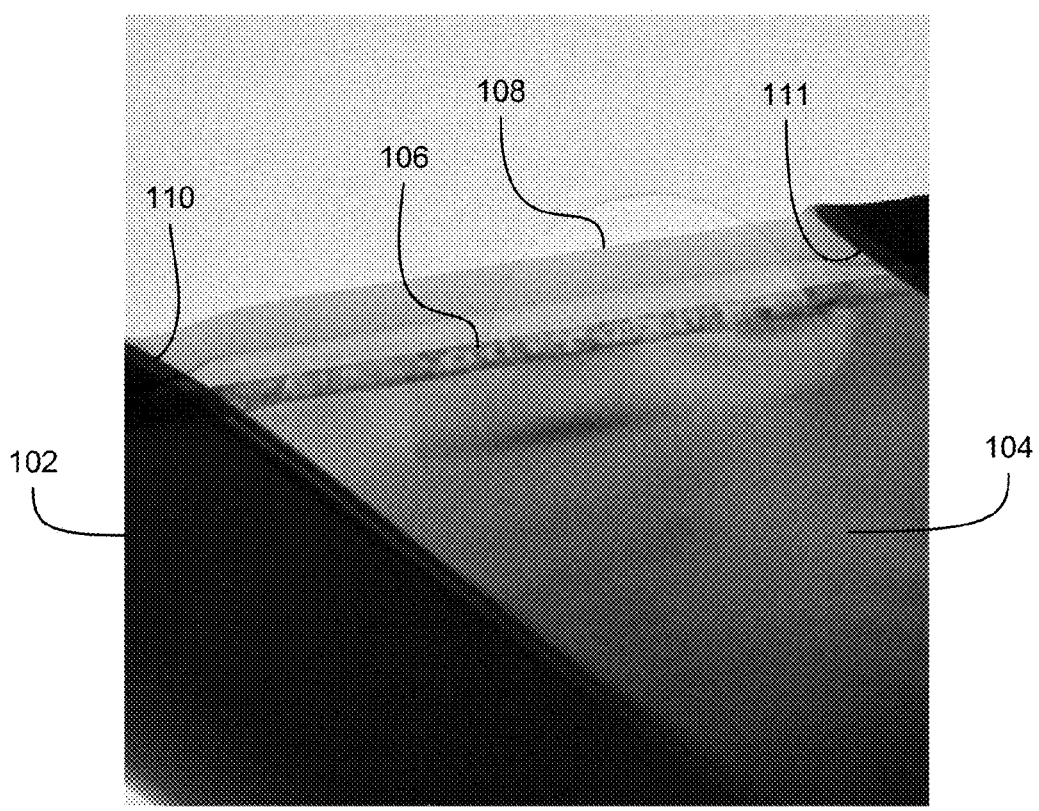
FIG. 16 shows an enlarged view of the image of the lamella shown in FIG. 15.

At step 1110, the orientation of the region of interest is identified. The orientation of the region of interest defines the stepping direction that is used to step from the first image location without requiring the use of image recognition of individual image features. An exemplary process of step 1110 for determining the orientation of the region of interest is shown in FIG. 11B. At step 1170, the image is processed to determine a line corresponding to the top of the lamella window. FIG. 16 shows an enlarged view of the image of the lamella 102 shown in FIG. 15. Lamella 102 has a lamella window 104. Lamella window 104 is a portion of lamella 102 that is thinned to a smaller thickness. Lamella window 104 is milled on lamella 102 where features (not shown) in region of interest 106 are located so that the features in region of interest 106 can be imaged with the TEM. Lamella 102 and lamella window 104 are milled so that they have a predetermined, known geometry that is readily recognized by pattern recognition logic. Pattern recognition logic processes the image and locates the line 108 corresponding to the top of lamella window 104. The position of the top of lamella window 104 is found reliably independent of the shape of the lamella. Line 108 is known in advance to be the horizontal or zero degree line. That is, line 108 is known to be parallel to the top surface of the sample from which the lamella was milled and/or parallel to the layer of region of interest 106. In the example shown in FIG. 16, line 110, corresponding to the left edge of lamella window 104, is also known in advance to be directed at a 45 degree angle to line 108. This angle is known because of the predetermined geometry defined for lamella window 104 when milling lamella 102. For example, during TEM sample preparation, lamella window 104 can be milled by a focused ion beam that is directed at a 45 degree angle to the top of the sample surface, which is substantially parallel to line 108. Similarly, line 111, corresponding to the right edge of lamella window 104, is known in advance to be directed at a 45 degree angle to line 108. This specific value of 45 degrees is not part of the present invention and is for illustrative purposes only.

Figure 17:
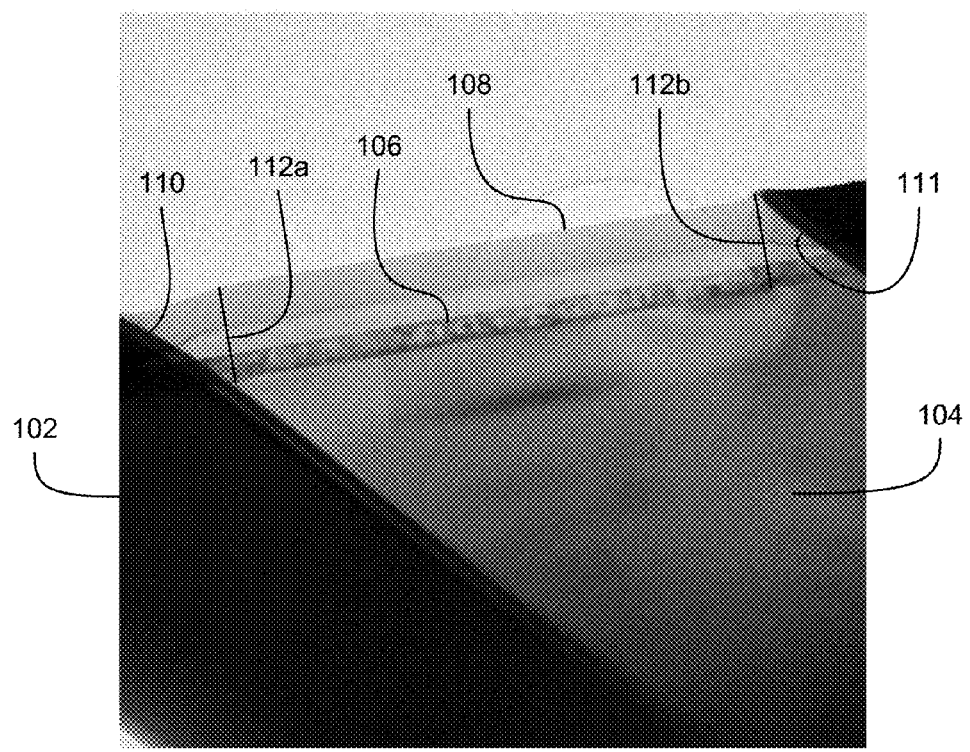
FIG. 17 shows two lines 112a and 112b perpendicular to line 108 extending from line 108 into the lamella to the bottom of the region of interest 106.

At step 1132, two lines perpendicular to the line corresponding to the top of the lamella window are computed. The two lines are adjacent to the edges of the window and extending away from the top of the window to define side boundaries of the region of interest. FIG. 17 shows two lines 112a and 112b perpendicular to line 108 extending from line 108 into the lamella to the bottom of the region of interest 106. Lines 112a and 112b define the side boundaries of the region of interest. Line 112a is perpendicular to line 108 and intersects region of interest 106 at the left boundary 112a of lamella window 104. Line 112b is perpendicular to line 108 and intersects region of interest 106 at the right boundary 112b of lamella window 104.

Figure 18A:
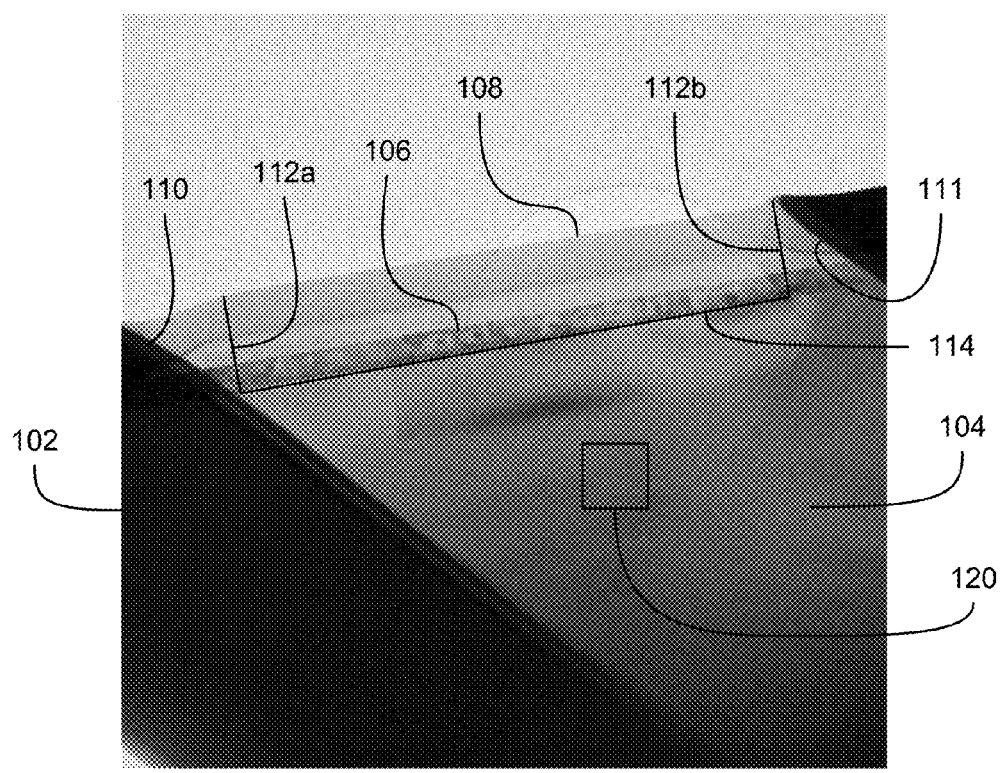
FIG. 18A shows the lower boundary line of the region of interest.

At step 1134, a lower boundary line of a region of interest is determined. The region bounded by the top of the lamella window, the sides of the lamella window, and the lower boundary is identified. The lower boundary line of the region of interest can be determined using a change in image contrast. Alternatively, the lower boundary line of the region of interest can be determined by placing the lower boundary a predetermined distance below the top of the lamella window. FIG. 18A shows lower boundary line 114. The combination of the top, sides and bottom of the lamella window defines the perimeter of the lamella window.

Figure 18B:
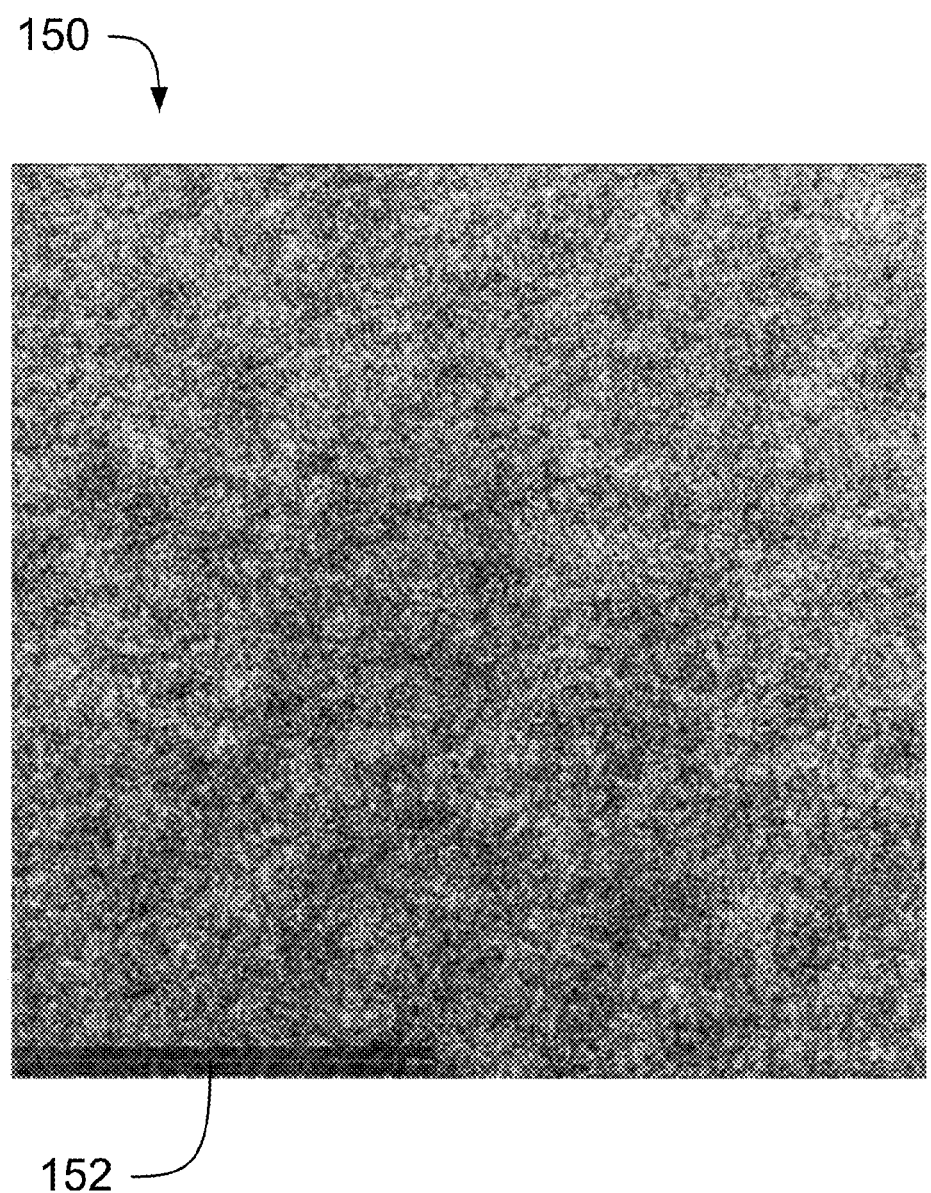
FIG. 18B shows a close-up image of the region of interest in FIG. 18A used to produce the FFT pattern in FIG. 19.
Figure 19:
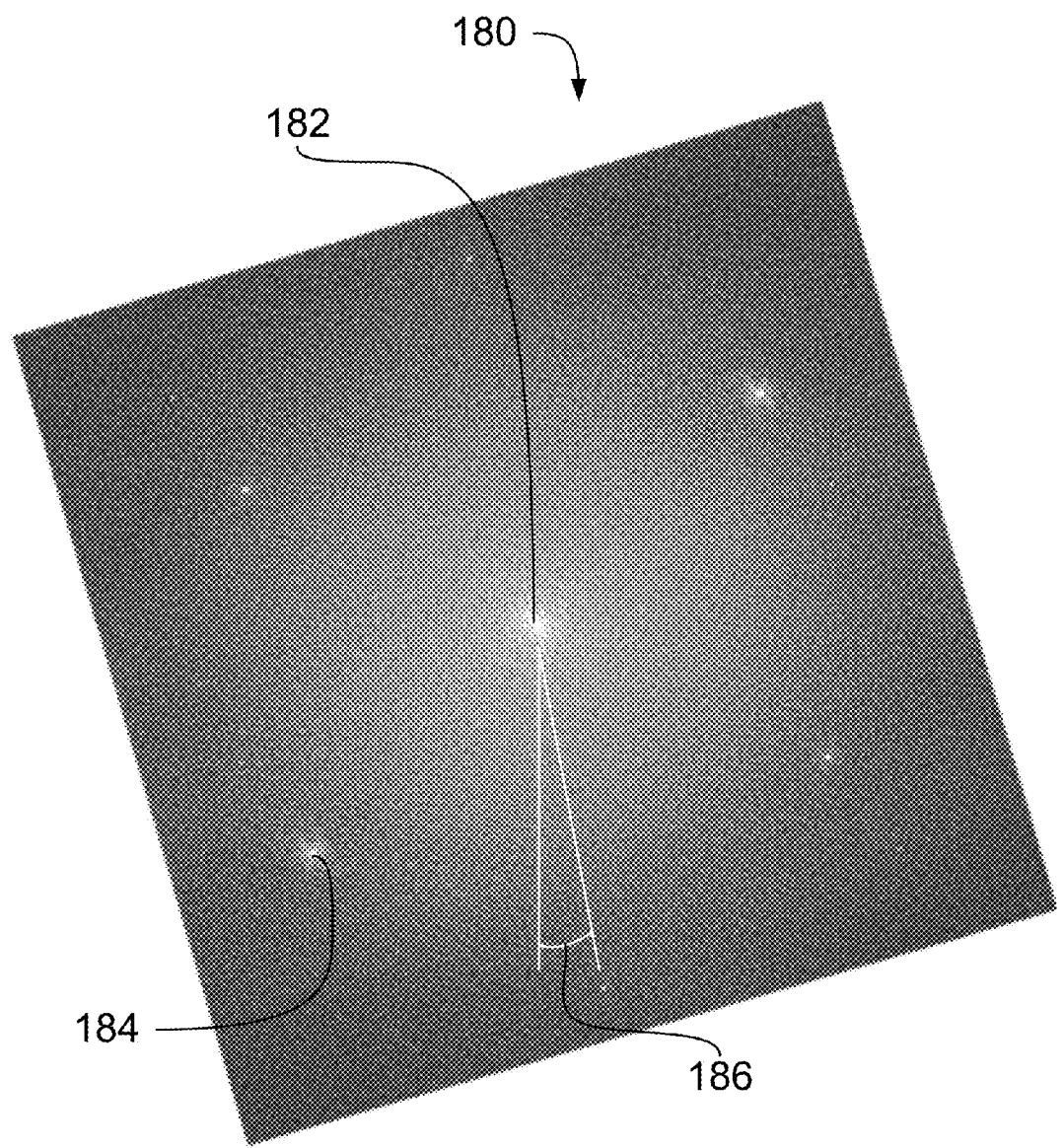
FIG. 19 shows a Fast Fourier Transform (FFT) of the region shown in FIG. 18B.

Returning to FIG. 11A, at step 1116, the orientation of the region of interest 120 is determined. The orientation of the region of interest 120 defines a stepping direction. The stepping direction is defined as the rotation of the line along which the regions of interest are located. FIG. 18B shows a close-up view 150 of a region of the substrate 120 in FIG. 18A, with a 100 nm scale bar 152. FIG. 19 is a Fast Fourier Transform (FFT) 180 of the image in FIG. 18B. The center (unscattered) spot 182 is surrounded by six first-order spots 184. Region 120 in FIG. 18A is imaged in FIG. 18B, and corresponds to the crystalline Silicon substrate beneath the lamella—the angular orientation of the Silicon relative to the wafer surface, and thus relative to the lamella, is predetermined, thus by determining the rotational orientation of the Silicon the rotational orientation of the lamella may also be found. Angle 186 between one of the six spots 184 and the vertical in the image corresponds to the rotation angle (a few degrees CCW) of the lamella in FIGS. 16-18A. Alternatively, the orientation of the region of interest can be determined by directing the electron beam onto the lamella window at location 120 and observing an electron diffraction pattern of electrons transmitted through the lamella window. An FFT of an image essentially corresponds to what an electron diffraction pattern would look like. A still further method for determining the orientation of the region of interest is to employ edge finders on images of the lamella window or a lamella edge. An edge finder is an image processing algorithm to locate changes in contrast with an image.

Figure 20:
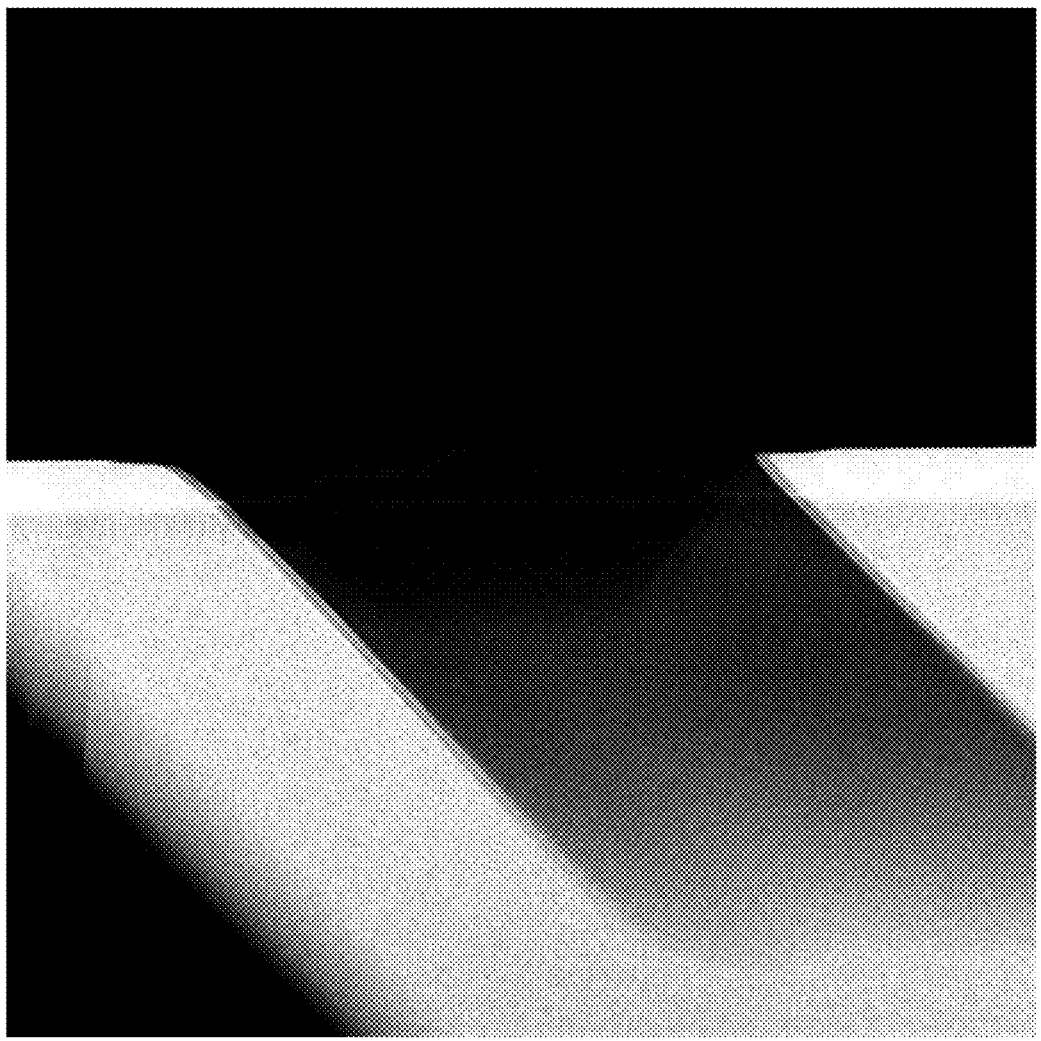
FIG. 20 shows the image in STEM mode after rotating the image using the orientation calculated from the FFT.

At step 1118, the TEM grid is physically rotated to align the region of interest with the TEM axis using the angle determined from FIG. 19. The TEM grid can be physically rotated by rotating the sample stage or by rotating the TEM grid on the sample stage. Alternatively or in addition to step 1118 is step 1120. At step 1120, the image is rotated using digital signal processing and the determined orientation to align the region of interest with the TEM axis without physically moving the TEM grid. In a preferred embodiment, after centering the electron beam on the region of interest the system is switched to STEM mode. Rotation is digitally applied to the image using the orientation calculated from the FFT or the electron diffraction pattern, either one taken from region 120. FIG. 20 shows the image in STEM mode after rotating the image using the orientation calculated from the FFT or the electron diffraction pattern from region 120.

Figure 21:
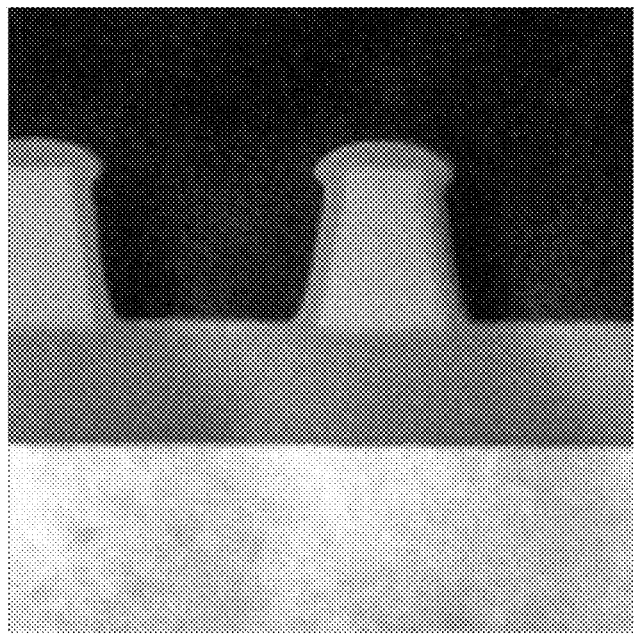
FIG. 21 shows features on the region of interest at the desired field of view (FOV) in STEM mode.
Figure 22:
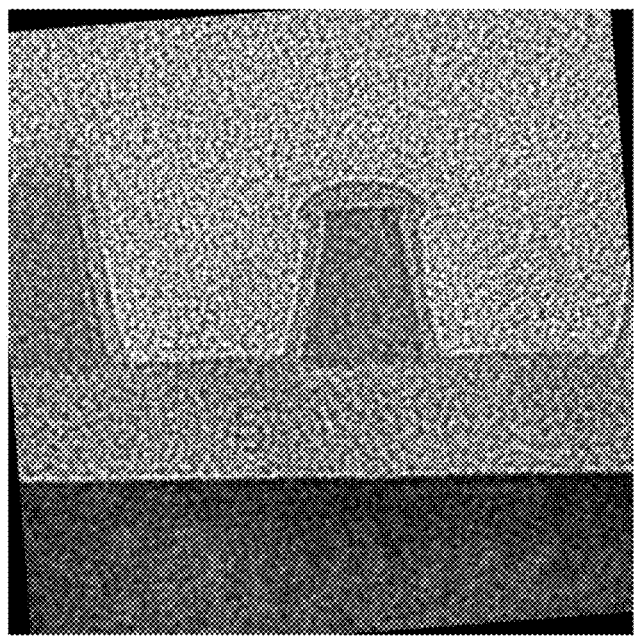
FIG. 22 shows features on the region of interest at the desired field of view (FOV) in TEM mode.

At step 1122, a first image of a portion of the region of interest is obtained to identify a portion of the region of interest. The first image is preferably obtained using STEM mode. FIG. 21 shows features on the region of interest at the desired field of view (FOV). As shown in FIG. 22, the system is preferably switched back into TEM mode after the image of the region of interest at the desired field of view is obtained in STEM mode.

Figure 23:
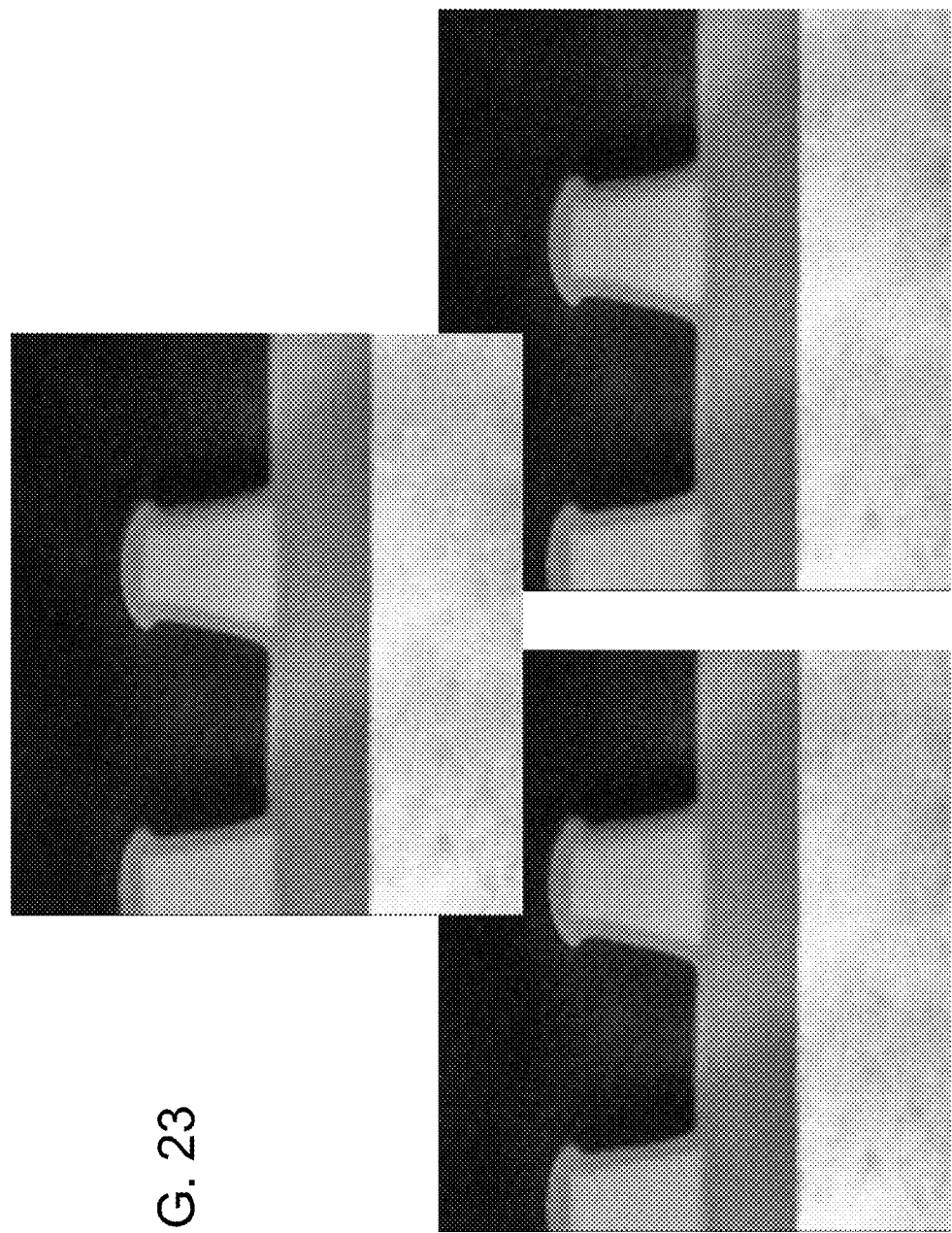
FIG. 23 shows three separate overlapping images that can be montaged into a single image.
Figure 24:
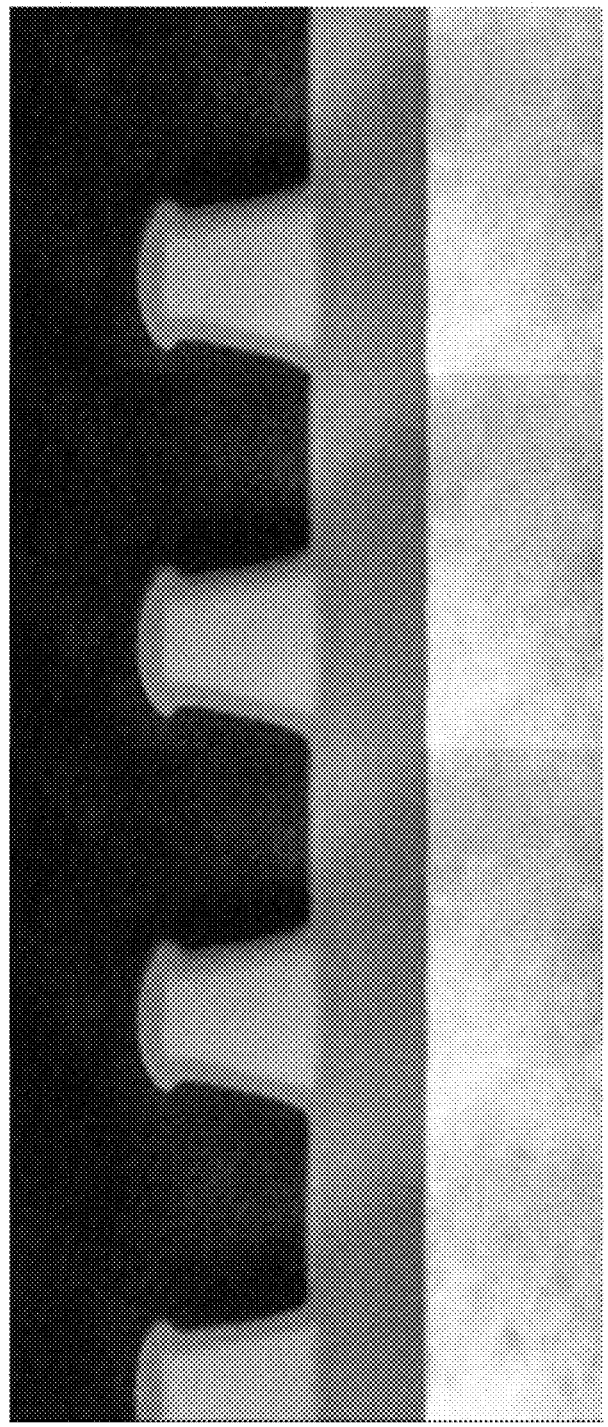
FIG. 24 shows a montage of the three overlapping images of FIG. 23.

At step 1124, multiple images are obtained by stepping from a position of the first image along the stepping direction to obtain multiple images of portions of the region of interest, where the multiple images are obtained without using image recognition of the individual features to be examined in the region of interest. The multiple images are preferably obtained in TEM mode. The multiple images can be formed into a montage of the region of interest by removing the overlapping portions of the individual images according to known image processing techniques. FIG. 23 shows three separate overlapping images that can be montaged into a single image. FIG. 24 shows a montage of the three overlapping images of FIG. 23.

By determining the orientation of the region of interest and compensating for the orientation, the TEM can march along the row of the region of interest in either direction and still have the features within the field of view. In effect, embodiments of the present invention enable the location of a row of devices in a region of interest independent of the orientation of the lamella due to the predetermined geometry of the lamella. Embodiments of the present invention enable the system to zoom in and not lose the feature of interest and to "sail without a compass," that is, march along the row of devices in a certain direction and still have the devices in the field of view. The ability to zoom in and not lose the feature of interest and to "sail without a compass" reduces time required of the operator and enables methods of automation for the analysis of batches of lamellae.

Although the present invention and its advantages have been described in detail, it should be understood that various changes, substitutions and alterations can be made herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of automatically imaging in a transmission electron microscope (TEM) features in a region of interest on a lamella window without requiring knowledge of the features to be imaged, comprising:
   providing a lamella having a known geometry on a TEM grid in a TEM, the lamella having a lamella window, the lamella window comprising a portion of the lamella that is thinned to a smaller thickness than the rest of the lamella, the lamella window comprising at least a portion of the region of interest;
   directing an electron beam toward the TEM grid to form images comprising the lamella window;
   determining a perimeter of the lamella window within the images;
   determining an orientation of the region of interest, wherein the orientation of the region of interest defines a stepping direction;
   obtaining a first image of a portion of the region of interest to identify a portion of the region of interest; and
   obtaining multiple images by stepping from a position of the first image along the stepping direction to obtain multiple images of portions of the region of interest, where the multiple images are obtained without using image recognition of the individual features to be examined in the region of interest.

2. The method of claim 1 wherein determining the perimeter of the lamella window comprises the steps of:
   processing the image to determine a line corresponding to the top of the lamella window;
   computing two lines perpendicular to the line corresponding to the top of the lamella window, the two lines being adjacent to the edges of the window and extending away from the top of the window to define side boundaries of the region of interest; and
   determining a lower boundary line of the region of interest.

3. The method of claim 1 further comprising forming a montage of the multiple images.

4. The method of claim 1 in which determining an orientation of the region of interest further comprises directing the electron beam at the lamella and observing the pattern of electrons transmitted through the window.

5. The method of claim 4 in which directing the electron beam at the lamella comprises directing the electron beam toward a substrate below the lamella window.

6. The method of claim 5 in which observing the pattern of electrons transmitted through the window comprises performing a Fourier transform on a high resolution image of the substrate.

7. The method of claim 5 in which observing the pattern of electrons transmitted through the window includes determining the orientation of a diffraction pattern.

8. The method of claim 4 in which directing the electron beam at the lamella comprises directing the electron beam towards the lamella to acquire an image; and determining an orientation of the region of interest includes determining the orientation from processing the image.

9. The method of claim 8 in which processing the image comprises using edge finders.

10. The method of claim 8 in which processing the image comprises using pattern matching.

11. The method of claim 4 further comprising re-orienting the multiple images in accordance with the determined stepping direction.

12. The method of claim 2 in which determining a lower boundary line of a region of interest comprises using edge finders.

13. The method of claim 2 in which determining a lower boundary line of a region of interest comprises placing the lower boundary a predetermined distance below the top of the lamella window.

14. A transmission electron microscope (TEM) programmed to automatically image features in a region of interest on a lamella window without requiring knowledge of the features to be imaged, the transmission electron microscope comprising:
 an electron source;
 a focusing column for focusing electrons from the electron source into a beam;
 a detector for detecting electrons or secondary particles;
 a sample stage for supporting and moving a sample disposed on the sample stage;
 a controller programmed with computer executable instructions that, when executed by the controller, cause the microscope to perform the steps of:
  directing the electron beam toward a TEM grid, the TEM grid including a lamella having a known geometry, the lamella having a lamella window, the lamella window comprising a portion of the lamella that is thinned to a smaller thickness than the rest of the lamella, the lamella window comprising at least a portion of the region of interest, to form images comprising the lamella window;
  processing the image to determine a perimeter of the lamella window within the images;
  determining an orientation of the region of interest, wherein the orientation of the region of interest defines a stepping direction;
  obtaining a first image of a portion of the region of interest to identify a portion of the region of interest; and
  obtaining multiple images by stepping from a position of the first image along the stepping direction to obtain multiple images of portions of the region of interest, where the multiple images are obtained without using image recognition of the individual features to be examined in the region of interest.

15. The transmission electron microscope of claim 14 wherein processing the image to determine the perimeter of the lamella window comprises the steps of:
 processing the image to determine a line corresponding to the top of the lamella window;
 processing the image to compute two lines perpendicular to the line corresponding to the top of the lamella window, the two lines being adjacent to the edges of the window and extending away from the top of the window to define side boundaries of the region of interest; and
 processing the image to determine a lower boundary line of the region of interest.

16. The transmission electron microscope of claim 14 further comprising instructions for forming a montage of the multiple images.

17. The transmission electron microscope of claim 14 in which the instructions for determining an orientation of the region of interest further comprise instructions for directing the electron beam at the lamella and observing the pattern of electrons transmitted through the window.

18. The transmission electron microscope of claim 17 in which directing the electron beam at the lamella comprises directing the electron beam toward substrate below the lamella window.

19. The transmission electron microscope of claim 18 in which observing the pattern of electrons transmitted through the window comprises performing a Fourier transform on a high resolution image of the substrate.

20. The transmission electron microscope of claim 18 in which observing the pattern of electrons transmitted through the window includes determining the orientation of a diffraction pattern.

* * * * *